United States Patent
Kim (10) Patent No.: US 11,595,060 B2
(45) Date of Patent: Feb. 28, 2023

(54) METHOD AND APPARATUS FOR DECODING LOW-DENSITY PARITY-CHECK CODE

(71) Applicant: ELECTRONICS AND TELECOMMUNICATIONS RESEARCH INSTITUTE, Daejeon (KR)

(72) Inventor: Nam Il Kim, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 17/377,643

(22) Filed: Jul. 16, 2021

(65) Prior Publication Data

US 2022/0038114 A1    Feb. 3, 2022

(30) Foreign Application Priority Data

Jul. 29, 2020  (KR) .................. 10-2020-0094725

(51) Int. Cl.
  *H03M 13/11*       (2006.01)
(52) U.S. Cl.
  CPC ............................. *H03M 13/1117* (2013.01)
(58) Field of Classification Search
  CPC ............ H03M 13/1117; H03M 13/116; H03M 13/112; H03M 13/1105; H03M 13/1128
  See application file for complete search history.

(56) References Cited

U.S. PATENT DOCUMENTS

| | | |
|---|---|---|
| 7,752,523 B1 * | 7/2010 | Chaichanavong .......................... H03M 13/1125 714/755 |
| 9,048,874 B2 | 6/2015 | Wang et al. |
| 9,088,302 B2 | 7/2015 | Yang et al. |
| 10,177,786 B2 | 1/2019 | Wu |
| 10,425,104 B2 | 9/2019 | Kim et al. |
| 10,498,363 B2 | 12/2019 | Kim et al. |
| 10,680,647 B2 | 6/2020 | Bhatia et al. |

(Continued)

FOREIGN PATENT DOCUMENTS

| KR | 10-2015-0121966 A | 10/2015 |
|---|---|---|
| KR | 10-1630114 B1 | 6/2016 |
| KR | 10-1881877 B1 | 7/2018 |

OTHER PUBLICATIONS

W. Cui, Y. Yang, X. Jiang and S. Kim, "Modified tree structure approach for finding the first two minimum values," 2014 IEEE China Summit & International Conference on Signal and Information Processing (ChinaSIP), 2014.*

(Continued)

*Primary Examiner* — Steve N Nguyen
(74) *Attorney, Agent, or Firm* — LRK Patent Law Firm (57) ABSTRACT

A method for decoding a low-density parity-check (LDPC) code, performed by a communication apparatus, includes: updating a variable node; determining n minimum values based on a min-sum algorithm (MSA); determining n indices based on the n minimum values; updating a check node using the n indices; calculating a log-likelihood ratio (LLR) value when the update of the check node is completed; and determining an information bit based on the LLR value.

11 Claims, 9 Drawing Sheets

(56) References Cited

U.S. PATENT DOCUMENTS

| | | | |
|---|---|---|---|
| 2005/0138519 A1* | 6/2005 | Boutillon | H03M 13/1117 714/752 |
| 2005/0149844 A1* | 7/2005 | Tran | H04L 1/0058 714/800 |
| 2007/0089018 A1* | 4/2007 | Tang | H03M 13/1145 714/752 |
| 2007/0089019 A1* | 4/2007 | Tang | H03M 13/1102 714/752 |
| 2008/0082868 A1* | 4/2008 | Tran | H03M 13/1125 714/699 |
| 2010/0122139 A1* | 5/2010 | Wang | H04L 1/0057 714/752 |
| 2013/0283117 A1* | 10/2013 | Yang | H03M 13/1117 714/752 |
| 2019/0097656 A1* | 3/2019 | Bhatia | H03M 13/112 |
| 2019/0109601 A1 | 4/2019 | Owen et al. | |
| 2019/0312594 A1 | 10/2019 | Vanaparthy et al. | |
| 2020/0336156 A1* | 10/2020 | Kim | H03M 13/114 |
| 2021/0218418 A1* | 7/2021 | Noh | H04L 1/00 |

OTHER PUBLICATIONS

S. S. Bhojane, M. V. Mankar, G. M. Asutkarand P. K. Dakhole, "Design of low density parity check decoder using Min-Sum algorithm," 2015 International Conference on Communications and Signal Processing (ICCSP), 2015.*

Hee-Ran Lee et al., "Combined Normalized and Offset Min-Sum Algorithm for Low-Density Parity-Check Codes", JBE vol. 25, No. 1, Jan. 2020.

* cited by examiner

METHOD AND APPARATUS FOR DECODING LOW-DENSITY PARITY-CHECK CODE

CROSS-REFERENCE TO RELATED APPLICATION(S)

This application claims priority to Korean Patent Application No. 10-2020-0094725 filed on Jul. 29, 2020 with the Korean Intellectual Property Office (KIPO), the entire content of which is hereby incorporated by reference.

BACKGROUND

1. Technical Field

The present disclosure relates to a technique for decoding a low-density parity-check (LDPC) code, and more specifically, to a technique for decoding an LDPC code using a min-sum algorithm (MSA).

2. Description of Related Art

The communication system (hereinafter, new radio (NR) communication system) using a higher frequency band (e.g., a frequency band of 6 GHz or higher) than a frequency band (e.g., a frequency band lower below 6 GHz) of the long term evolution (LTE) (or, LTE-A) is being considered for processing of soaring wireless data. The NR communication system may support not only a frequency band below 6 GHz but also 6 GHz or higher frequency band. In addition, the NR communication system may provide a communication service in a wide band (e.g., a bandwidth up to 100 GHz). The NR communication system may support various communication services and scenarios as compared to the LTE communication system. For example, usage scenarios of the NR communication system may include enhanced mobile broadband (eMBB), ultra-reliable low-latency communication (URLLC), massive machine type communication (mMTC), and the like. Communication technologies are needed to meet requirements of eMBB, URLLC, and mMTC.

Meanwhile, an error correction code may be used for reliable data transmission in the communication system. For example, a low-density parity-check (LDPC) code may be used. In this case, a transmitting node (e.g., base station or terminal) may perform an encoding operation on data (e.g., information bits) using an LDPC code, and a receiving node (e.g., terminal or base station) may obtain the data (e.g., information bits) by performing a decoding operation based on the LDPC code. When the LDPC code is used, error correction capability at the receiving node can be improved.

The transmitting node may perform the encoding operation on the data using a parity check matrix. The parity check matrix may be referred to as an 'H matrix'. The H matrix may consist of M rows and N columns. Each of M and N may be a natural number equal to or greater than 1. The elements included in the H matrix may be binary numbers (e.g., 0 or 1). The density of '1's included in the H matrix may be low. The receiving node may correct errors by performing the decoding operation using the H matrix (e.g., the H matrix that has been used for the encoding operation in the transmitting node).

An iterative decoding operation may be performed to decode the LDPC code. The decoding operation on the LDPC code may be performed using a message-passing algorithm or a brief-propagation algorithm (BPA). When the above-described algorithm(s) is used, the decoding operation may be performed through exchange of log-likelihood ratio (LLR) probability messages (or LLR messages) between variable nodes and check nodes. When the BPA is used, the check nodes may perform complex calculations to perform an update operation based on the LLR probability messages. Due to the high computational complexity, the decoding operation on the LDPC code based on the BPA may not be easily implemented by hardware and/or software.

In order to solve the problem of high computational complexity, a min-sum algorithm (MSA) may be used. In this case, the update operation for the check nodes may be performed based on selective calculation of a minimum value. That is, the calculation for the update operation on the check nodes may be approximated to the selective calculation of the minimum value. When the MSA is used in decoding the LDPC code, an approximation error may occur. Due to the approximation error, the decoding performance by the MSA may be lower than the decoding performance by the BPA.

In order to compensate for such the problem, a normalization (N)-MSA or offset (O)-MSA may be used in the decoding operation on the LDPC code. However, when the N-MSA is used, additional calculation and/or channel information may be required to derive a normalization coefficient. When the O-MSA is used, additional calculation and/or channel information may be required to derive an offset coefficient. Accordingly, there is a need for decoding methods having low computational complexity and high error correction capability.

SUMMARY

Accordingly, exemplary embodiments of the present disclosure are directed to providing a method and an apparatus for decoding an LDPC code based on the MSA.

According to a first exemplary embodiment of the present disclosure, a method for decoding an LDPC code, performed by a communication apparatus, may comprise: updating a variable node; determining n minimum values based on a min-sum algorithm (MSA); determining n indices based on the n minimum values; updating a check node using the n indices; calculating an LLR value when the update of the check node is completed; and determining an information bit based on the LLR value, wherein n is a natural number equal to or greater than 2.

The n minimum values may include a first minimum value, a second minimum value, and a third minimum value, and the n indices may include a first index corresponding to the first minimum value, a second index corresponding to the second minimum value, and a third index corresponding to the third minimum value.

The check node may be updated based on the MSA in which a normalization coefficient is reflected.

The check node may be updated based on the MSA in which an offset is reflected.

The method may further comprise initializing one or more parameters used for decoding the LDPC code, wherein after the initialization of the one or more parameters is completed, the update operation of the variable node is performed.

The variable node and the check node may belong to a Tanner graph, and the Tanner graph may be generated based on an H matrix used for encoding the LDPC code.

When a cyclic redundancy check (CRC) or syndrome check for the information bit succeeds, the decoding of the LDPC code is terminated, and when the CRC or syndrome check for the information bit fails, the decoding is iteratively performed.

According to a second exemplary embodiment of the present disclosure, a communication apparatus for decoding an LDPC code may comprise a processor, a memory electronically communicating with the processor, and instructions stored in the memory, and when executed by the processor, the instructions may cause the communication apparatus to: update a variable node; determine n minimum values based on an MSA; determine n indices based on the n minimum values; update a check node using the n indices; calculate an LLR value when the update of the check node is completed; and determine an information bit based on the LLR value, wherein n is a natural number equal to or greater than 2.

The n minimum values may include a first minimum value, a second minimum value, and a third minimum value, and the n indices may include a first index corresponding to the first minimum value, a second index corresponding to the second minimum value, and a third index corresponding to the third minimum value.

The check node may be updated based on the MSA in which a normalization coefficient is reflected.

The check node may be updated based on the MSA in which an offset is reflected.

The variable node and the check node may belong to a Tanner graph, and the Tanner graph may be generated based on an H matrix used for encoding the LDPC code.

When a cyclic redundancy check (CRC) or syndrome check for the information bit succeeds, the decoding of the LDPC code is terminated, and when the CRC or syndrome check for the information bit fails, the decoding is iteratively performed.

According to the exemplary embodiments of the present disclosure, a decoding operation of a low-density parity-check (LDPC) code may be performed based on the min-sum algorithm (MSA). Here, a plurality of minimum values may be determined, and an update operation of check nodes may be performed using the plurality of minimum values (e.g., indices corresponding to the plurality of minimum values). The performance of the decoding operation using the plurality of minimum values may be improved over the performance of the decoding operation using one minimum value. In addition, the decoding operation proposed in the present disclosure may be performed without additional operation(s) (e.g., additional operation(s) required for the conventional N-MSA or O-MSA). Accordingly, the performance of the communication system can be improved.

DETAILED DESCRIPTION OF THE EMBODIMENTS

Embodiments of the present disclosure are disclosed herein. However, specific structural and functional details disclosed herein are merely representative for purposes of describing embodiments of the present disclosure. Thus, embodiments of the present disclosure may be embodied in many alternate forms and should not be construed as limited to embodiments of the present disclosure set forth herein.

Accordingly, while the present disclosure is capable of various modifications and alternative forms, specific embodiments thereof are shown by way of example in the drawings and will herein be described in detail. It should be understood, however, that there is no intent to limit the present disclosure to the particular forms disclosed, but on the contrary, the present disclosure is to cover all modifications, equivalents, and alternatives falling within the spirit and scope of the present disclosure. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the present disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present disclosure will be described in greater detail with reference to the accompanying drawings. In order to facilitate general understanding in describing the present disclosure, the same components in the drawings are denoted with the same reference signs, and repeated description thereof will be omitted.

A communication system to which exemplary embodiments according to the present disclosure are applied will be described. The communication system may be the 4G communication system (e.g., Long-Term Evolution (LTE) communication system or LTE-A communication system), the 5G communication system (e.g., New Radio (NR) communication system), or the like. The 4G communication system may support communications in a frequency band of 6 GHz or below, and the 5G communication system may support communications in a frequency band of 6 GHz or above as well as the frequency band of 6 GHz or below. The communication system to which the exemplary embodiments according to the present disclosure are applied is not limited to the contents described below, and the exemplary embodiments according to the present disclosure may be applied to various communication systems. Here, the communication system may be used in the same sense as a communication network, 'LTE' may refer to '4G communication system', 'LTE communication system', or 'LTE-A communication system', and 'NR' may refer to '5G communication system' or 'NR communication system'.

Figure 1:
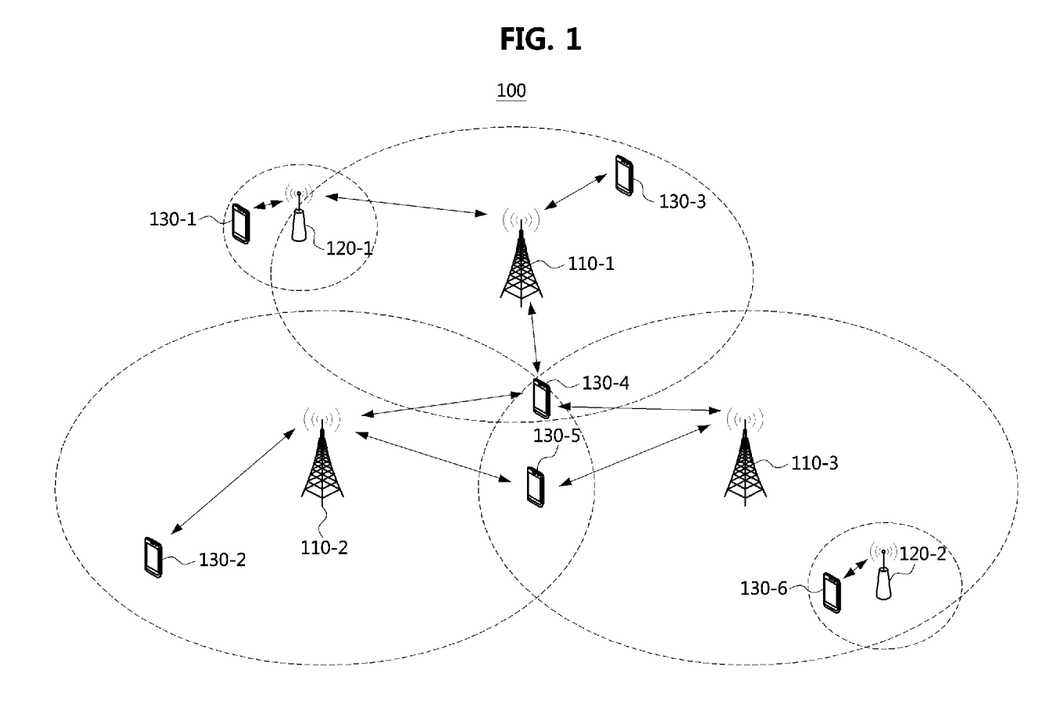
FIG. 1 is a conceptual diagram illustrating a first exemplary embodiment of a communication system.

FIG. 1 is a conceptual diagram illustrating a first exemplary embodiment of a communication system.

Referring to FIG. 1, a communication system 100 may comprise a plurality of communication nodes 110-1, 110-2, 110-3, 120-1, 120-2, 130-1, 130-2, 130-3, 130-4, 130-5, and 130-6. Also, the communication system 100 may further comprise a core network (e.g., a serving gateway (S-GW), a packet data network (PDN) gateway (P-GW), and a mobility management entity (MME)). When the communication system 100 is a 5G communication system (e.g., New Radio (NR) system), the core network may include an access and mobility management function (AMF), a user plane function (UPF), a session management function (SMF), and the like.

The plurality of communication nodes 110 to 130 may support communication protocols defined in the 3rd generation partnership project (3GPP) technical specifications (e.g., LTE communication protocol, LTE-A communication protocol, NR communication protocol, or the like). The plurality of communication nodes 110 to 130 may support code division multiple access (CDMA) based communication protocol, wideband CDMA (WCDMA) based communication protocol, time division multiple access (TDMA) based communication protocol, frequency division multiple access (FDMA) based communication protocol, orthogonal frequency division multiplexing (OFDM) based communication protocol, filtered OFDM based communication protocol, cyclic prefix OFDM (CP-OFDM) based communication protocol, discrete Fourier transform-spread-OFDM (DFT-s-OFDM) based communication protocol, orthogonal frequency division multiple access (OFDMA) based communication protocol, single carrier FDMA (SC-FDMA) based communication protocol, non-orthogonal multiple access (NOMA) based communication protocol, generalized frequency division multiplexing (GFDM) based communication protocol, filter band multi-carrier (FBMC) based communication protocol, universal filtered multi-carrier (UFMC) based communication protocol, space division multiple access (SDMA) based communication protocol, or the like. Each of the plurality of communication nodes may have the following structure. The communication node may be referred to as a 'communication apparatus'.

Figure 2:
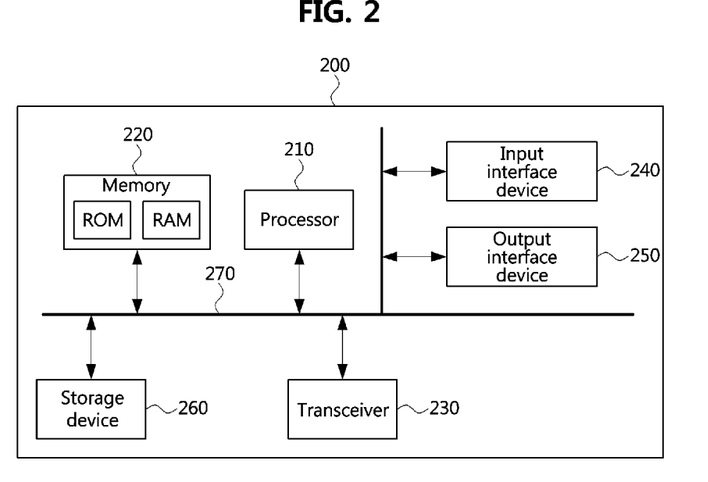
FIG. 2 is a block diagram illustrating a first exemplary embodiment of a communication node constituting a communication system.

FIG. 2 is a block diagram illustrating a first exemplary embodiment of a communication node constituting a communication system.

Referring to FIG. 2, a communication node 200 may comprise at least one processor 210, a memory 220, and a transceiver 230 connected to the network for performing communications. Also, the communication node 200 may further comprise an input interface device 240, an output interface device 250, a storage device 260, and the like. Each component included in the communication node 200 may communicate with each other as connected through a bus 270.

The processor 210 may execute a program stored in at least one of the memory 220 and the storage device 260. The processor 210 may refer to a central processing unit (CPU), a graphics processing unit (GPU), or a dedicated processor on which methods in accordance with embodiments of the present disclosure are performed. Each of the memory 220 and the storage device 260 may be constituted by at least one of a volatile storage medium and a non-volatile storage medium. For example, the memory 220 may comprise at least one of read-only memory (ROM) and random access memory (RAM).

Referring back to FIG. 1, the communication system 100 may comprise a plurality of base stations 110-1, 110-2, 110-3, 120-1, and 120-2, and a plurality of terminals 130-1, 130-2, 130-3, 130-4, 130-5, and 130-6. Each of the first base station 110-1, the second base station 110-2, and the third base station 110-3 may form a macro cell, and each of the fourth base station 120-1 and the fifth base station 120-2 may form a small cell. The fourth base station 120-1, the third terminal 130-3, and the fourth terminal 130-4 may belong to the cell coverage of the first base station 110-1. Also, the second terminal 130-2, the fourth terminal 130-4, and the fifth terminal 130-5 may belong to the cell coverage of the second base station 110-2. Also, the fifth base station 120-2, the fourth terminal 130-4, the fifth terminal 130-5, and the sixth terminal 130-6 may belong to the cell coverage of the third base station 110-3. Also, the first terminal 130-1 may belong to the cell coverage of the fourth base station 120-1, and the sixth terminal 130-6 may belong to the cell coverage of the fifth base station 120-2.

Here, each of the plurality of base stations 110-1, 110-2, 110-3, 120-1, and 120-2 may be referred to as NodeB (NB), evolved NodeB (eNB), gNB, advanced base station (ABS), high reliability-base station (HR-BS), base transceiver station (BTS), radio base station, radio transceiver, access point (AP), access node, radio access station (RAS), mobile multihop relay-base station (MMR-BS), relay station (RS), advanced relay station (ARS), high reliability-relay station (HR-RS), home NodeB (HNB), home eNodeB (HeNB), road side unit (RSU), radio remote head (RRH), transmission point (TP), transmission and reception point (TRP), or the like.

Each of the plurality of terminals 130-1, 130-2, 130-3, 130-4, 130-5, and 130-6 may be referred to as user equipment (UE), terminal equipment (TE), advanced mobile station (AMS), high reliability-mobile station (HR-MS), terminal, access terminal, mobile terminal, station, subscriber station, mobile station, portable subscriber station, node, device, on-board unit (OBU), or the like.

Meanwhile, each of the plurality of base stations 110-1, 110-2, 110-3, 120-1, and 120-2 may operate in the same frequency band or in different frequency bands. The plurality of base stations 110-1, 110-2, 110-3, 120-1, and 120-2 may be connected to each other via an ideal backhaul link or a non-ideal backhaul link, and exchange information with each other via the ideal or non-ideal backhaul. Also, each of the plurality of base stations 110-1, 110-2, 110-3, 120-1, and 120-2 may be connected to the core network through the ideal backhaul link or non-ideal backhaul link. Each of the plurality of base stations 110-1, 110-2, 110-3, 120-1, and 120-2 may transmit a signal received from the core network to the corresponding terminal 130-1, 130-2, 130-3, 130-4, 130-5, or 130-6, and transmit a signal received from the corresponding terminal 130-1, 130-2, 130-3, 130-4, 130-5, or 130-6 to the core network.

In addition, each of the plurality of base stations 110-1, 110-2, 110-3, 120-1, and 120-2 may support a multi-input multi-output (MIMO) transmission (e.g., single-user MIMO (SU-MIMO), multi-user MIMO (MU-MIMO), massive MIMO, or the like), a coordinated multipoint (CoMP) transmission, a carrier aggregation (CA) transmission, a transmission in unlicensed band, a device-to-device (D2D) communication (or, proximity services (ProSe)), an Internet of Things (IoT) communication, a dual connectivity (DC), or the like. Here, each of the plurality of terminals 130-1, 130-2, 130-3, 130-4, 130-5, and 130-6 may perform operations corresponding to the operations of the plurality of base stations 110-1, 110-2, 110-3, 120-1, and 120-2 (i.e., the operations supported by the plurality of base stations 110-1, 110-2, 110-3, 120-1, and 120-2). For example, the second base station 110-2 may transmit a signal to the fourth terminal 130-4 in the SU-MIMO manner, and the fourth terminal 130-4 may receive the signal from the second base station 110-2 in the SU-MIMO manner. Alternatively, the second base station 110-2 may transmit a signal to the fourth terminal 130-4 and fifth terminal 130-5 in the MU-MIMO manner, and the fourth terminal 130-4 and fifth terminal 130-5 may receive the signal from the second base station 110-2 in the MU-MIMO manner.

Each of the first base station 110-1, the second base station 110-2, and the third base station 110-3 may transmit a signal to the fourth terminal 130-4 in the CoMP transmission manner, and the fourth terminal 130-4 may receive the signal from the first base station 110-1, the second base station 110-2, and the third base station 110-3 in the CoMP manner. Also, each of the plurality of base stations 110-1, 110-2, 110-3, 120-1, and 120-2 may exchange signals with the corresponding terminals 130-1, 130-2, 130-3, 130-4, 130-5, or 130-6 which belongs to its cell coverage in the CA manner. Each of the base stations 110-1, 110-2, and 110-3 may control D2D communications between the fourth terminal 130-4 and the fifth terminal 130-5, and thus the fourth terminal 130-4 and the fifth terminal 130-5 may perform the D2D communications under control of the second base station 110-2 and the third base station 110-3.

Hereinafter, methods of decoding an LDPC code in a communication system will be described. In particular, channel occupation methods, signal transmission methods, and channel occupation-related information transmission methods of a communication node (e.g., base station and/or terminal), for improving transmission reliability and delay time in a wireless communication system supporting communication in an unlicensed band, will be described. The following exemplary embodiments may be applied not only to an NR communication system but also to other communication systems (e.g., LTE communication system, fifth generation (5G) communication system, sixth generation (6G) communication system, or the like).

In the following exemplary embodiments, decoding methods performed by a decoder of an LDPC code will be described. For example, a calculation method of a variable node, a calculation method of a check node, and the like will be described. In addition, decoding methods without performing additional calculations required in the improved min-sum algorithm (MSA) (e.g., calculation of a normalization coefficient, calculation of an offset coefficient, calculation of channel information, calculation of received signal information (e.g., signal to noise ratio (SNR))) will be proposed. The improved MSA may be the normalization (N)-MSA, offset (O)-MSA, or the like. The error correction capability of the decoding methods proposed below may be improved compared to the error correction capability of the conventional decoding methods. Therefore, according to the decoding methods proposed below, data transmission efficiency can be improved.

The LDPC code may be an example of a linear block code. The LDPC code may be defined using a parity check matrix. The parity check matrix may be referred to as an 'H matrix'. The communication nodes (e.g., a transmitting node and a receiving node) performing data transmission/reception operations based on the LDPC code may be configured as follows.

Figure 3:
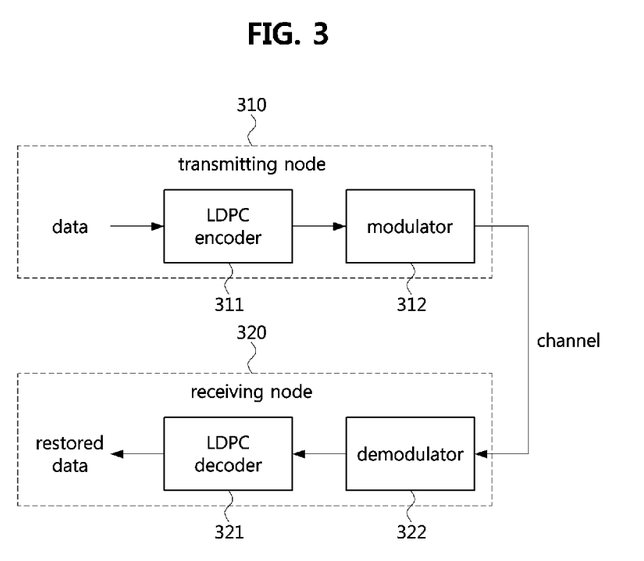
FIG. 3 is a block diagram illustrating a first exemplary embodiment of a communication node that transmits/receives data in a communication system.

FIG. 3 is a block diagram illustrating a first exemplary embodiment of a communication node that transmits/receives data in a communication system.

As shown in FIG. 3, a transmitting node 310 may include an LDPC encoder 311, a modulator 312, and the like. The operations of the LDPC encoder 311 and the modulator 312 may be performed by a processor (e.g., the processor 210 shown in FIG. 2) included in the transmitting node 310. The transmitting node 310 may be a base station or a terminal. A receiving node 320 may include an LDPC decoder 321, a demodulator 322, and the like. The operations of the LDPC decoder 321 and the demodulator 322 may be performed by a processor (e.g., the processor 210 shown in FIG. 2) included in the receiving node 320.

The receiving node 320 may be a terminal or a base station. In a data transmission operation, data (e.g., information bits) may be input to the LDPC encoder 311. The LDPC encoder 311 may perform an encoding operation on the data and may output coded data (e.g., codeword). The coded data may be input to the modulator 312. The modulator 312 may generate modulation symbol(s) by performing a modulation operation on the coded data. The modulation symbol(s) may be transmitted through a radio resource (e.g., channel).

The receiving node 320 may receive a signal (e.g., modulation symbol(s)) from the transmitting node 310. The demodulator 322 may generate demodulated symbol(s) by performing a demodulation operation on the signal. The demodulation symbol(s) may be input to the LDPC decoder 321. The demodulation symbol(s) input to the LDPC decoder 321 may be log-likelihood ratio (LLR) values (e.g., soft bits). The LDPC decoder 321 may restore the data by performing a decoding operation on the demodulated symbol(s). The decoding operation may be performed by exchanging LLR probability messages between check nodes and variable nodes in a Tanner graph.

Meanwhile, the LDPC decoder may perform an iterative decoding operation a preset number of times. For example, the LDPC decoder may perform an update operation for the check nodes, an update operation for the variable nodes, a hard decision operation for the coded bits, and a termination determination operation based on the LLR values. The decoding operation based on the brief-propagation algorithm (BPA) or MSA may be performed as follows.

Figure 4:
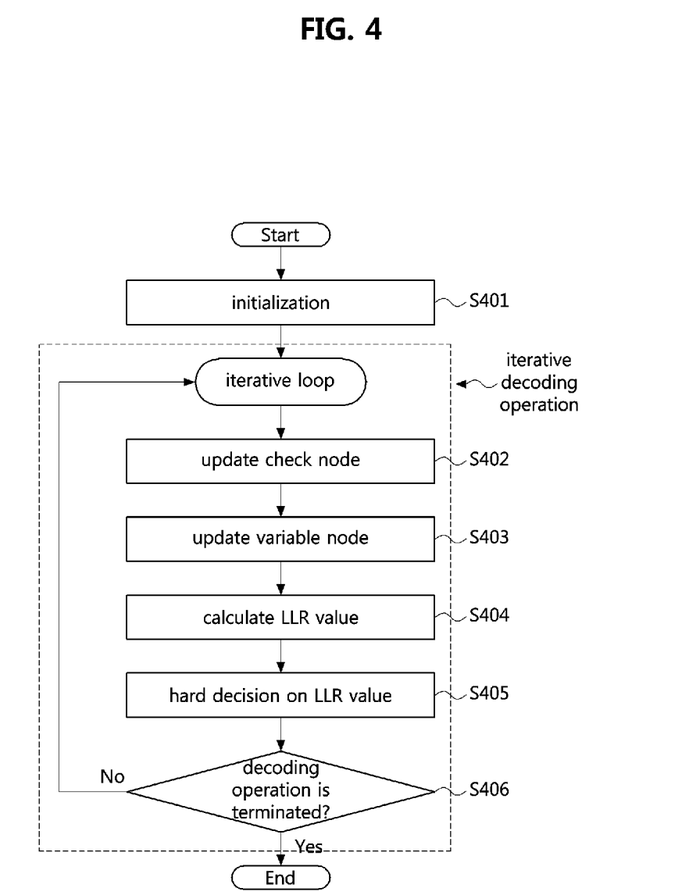
FIG. 4 is a flowchart illustrating a first exemplary embodiment of an LDPC code decoding operation.

FIG. 4 is a flowchart illustrating a first exemplary embodiment of an LDPC code decoding operation.

Referring to FIG. 4, the decoding operation of the LDPC code may be performed by the LDPC decoder 321 shown in FIG. 3. The operation(s) of the LDPC decoder 321 may be performed by the processor 210 shown in FIG. 2. Variables used in the iterative decoding operation of the LDPC code may be defined as shown in Table 1 below. The operation of the LDPC decoder may be described in an LLR domain to reduce complexity. Here, $$P_v = \log \frac{P_v(0)}{P_v(1)}$$

may be defined.

TABLE 1

| Variable | Description |
|---|---|
| H (H matrix) | A parity check matrix of an LDPC code composed of variable nodes (e.g., a set of variable nodes) and check nodes (e.g., a set of check nodes) |
| C | A set of check nodes |
| V | A set of variable nodes |
| $v \in \{1, 2, \ldots, V\}$ | Variable node, transmitted codeword, transmitted symbol |
| $c \in \{1, 2, \ldots, C\}$ | Check nodes of H matrix |
| $P_v$ | Channel information, prior LLR value. $P_v(0)$ indicates a probability that a transmitted bit v is 0. |
| $Q_{vc}$ | Message passing from a variable node v to a check node c |
| $Q_v$ | Total LLR information |
| $R_{cv}$ | Message passing from a check node c to a variable node v |
| $Q_{temp}$ | Bit information |

The BAP-based decoding operation may include an initialization operation (S401) and an iterative decoding operation (e.g., S402 to S405). The initialization operation S401 may refer to an initialization operation of messages of the variable nodes. The iterative decoding operation may include an update operation S402 of the check node, an update operation S403 of the variable node, an operation S404 of calculating LLR values, a hard decision operation S405 on the LLR values, and a termination determination operation S406 of the decoding operation. The steps S402 to S406 may be iteratively performed.

The receiving node (e.g., LDPC decoder included in the receiving node) may perform the initialization operation (S401). The receiving node may be a 'communication apparatus'. The initialization operation S401 may be performed based on Equation 1 below.

$$Q_v = P_v, R_{cv} = 0 \quad \text{[Equation 1]}$$

When the initialization operation S401 is completed, the receiving node may perform the update operation S402 of the check nodes. The update operation S402 of the check nodes may be performed based on Equation 2 below.

$$R_{cv} = \prod_{v' \in N(c)\setminus v} \text{sign}(Q_{v'c}) \cdot \varphi\left(\sum_{v' \in N(c)\setminus v} \varphi(|Q_{v'c}|)\right) \quad \text{[Equation 2]}$$

Here, $$\varphi(x) = -\log\left(\tanh\left(\frac{x}{2}\right)\right) = \log\left(\frac{e^x + 1}{e^x - 1}\right)$$

may be defined. When x is less than 0, sign(x) may be −1. When x is 0 or more, sign(x) may be 1.

When the update operation S402 of the check nodes is completed, the receiving node may perform the update operation S403 of the variable nodes. The update operation S403 of the variable nodes may be performed based on Equation 3 below.

$$Q_{vc} = P_v + \sum_{c' \in N(v)\setminus c} R_{c'v} \quad \text{[Equation 3]}$$

When the update operation S403 of the variable nodes is completed, the receiving node may calculate an LLR value for the variable node υ (S404). The LLR value for the variable node υ may be calculated based on Equation 4 below. Here, $\upsilon \in \{1, 2, \ldots, V\}$ may be defined.

$$Q_v = P_v + \sum_{c \in N(v)\setminus c} R_{cv} \quad \text{[Equation 4]}$$

When the operation S404 of calculating the LLR value is completed, the receiving node may determine an output value $\hat{y}_v$ by performing the hard decision operation S405 on the LLR value. The hard decision operation S405 may be performed based on Equation 5 below.

$$\hat{y}_v = \begin{cases} 0, & \text{sign}(Q_v) = 1 \\ 1, & \text{sign}(Q_v) = -1 \end{cases} \quad \text{[Equation 5]}$$

The receiving node may determine whether the decoding operation is terminated based on the output value $\hat{y}_v$ of the step S405 (S406). When a result of a syndrome check is $\hat{y}_v H^T = 0$, when a cyclic redundancy check (CRC) on the output value $\hat{y}_v$ is successful, or when the iterative decoding operation is performed as many as a preset number of iterations, the receiving node may be determined that the decoding operation is terminated (S406). When the above-described condition is not satisfied, the receiving node may determine that the decoding operation is not terminated, and may perform the iterative decoding operations (e.g., S402 to S406) again.

On the other hand, when the BPA is used, the complexity of calculation for the update operation S402 of the check nodes may be high. To solve this problem, the MSA may be used instead of the BPA. In this case, the step S402 may be performed based on Equation 6 below.

$$R_{cv} = \prod_{v' \in N(c) \setminus v} \text{sign}(Q_{v'c}) \cdot \min_{v' \in N(c)} |Q_{v'c}| \quad \text{[Equation 6]}$$

When the BPA is used, error correction capability may be degraded by approximation. To solve this problem, the N-MSA or O-MSA may be used. The N-MSA may be an MSA in which a normalization coefficient is reflected, and the O-MSA may be an MSA in which an offset is reflected.

When the N-MSA is used, the step S402 may be performed based on Equation 7 below. In Equation 7 below, α may be a normalization coefficient.

$$R_{cv} = \alpha \times \prod_{v' \in N(c) \setminus v} \text{sign}(Q_{v'c}) \cdot \min_{v' \in N(c)} |Q_{v'c}| \quad \text{[Equation 7]}$$

When the O-MSA is used, the step S402 may be performed based on Equation 8 below. In Equation 8 below, β may be an offset coefficient.

$$R_{cv} = \prod_{v' \in N(c) \setminus v} \text{sign}(Q_{v'c}) \cdot \max\left(\min_{v' \in N(c)} |Q_{v'c}| - \beta, 0\right) \quad \text{[Equation 8]}$$

Meanwhile, in the reliability-based LDPC code decoding operation, calculations for all check nodes may be performed to update the check nodes, and calculations for all variable nodes may be performed to update the variable nodes. In this case, there is a problem that a lot of memory is required. In order to solve this problem, a decoding operation that efficiently uses a memory and provides fast convergence performance is required. In order to efficiently use a memory, the LDPC code decoding operation may be performed as follows. Here, the decoding operation may be performed based on the MSA.

Figure 5:
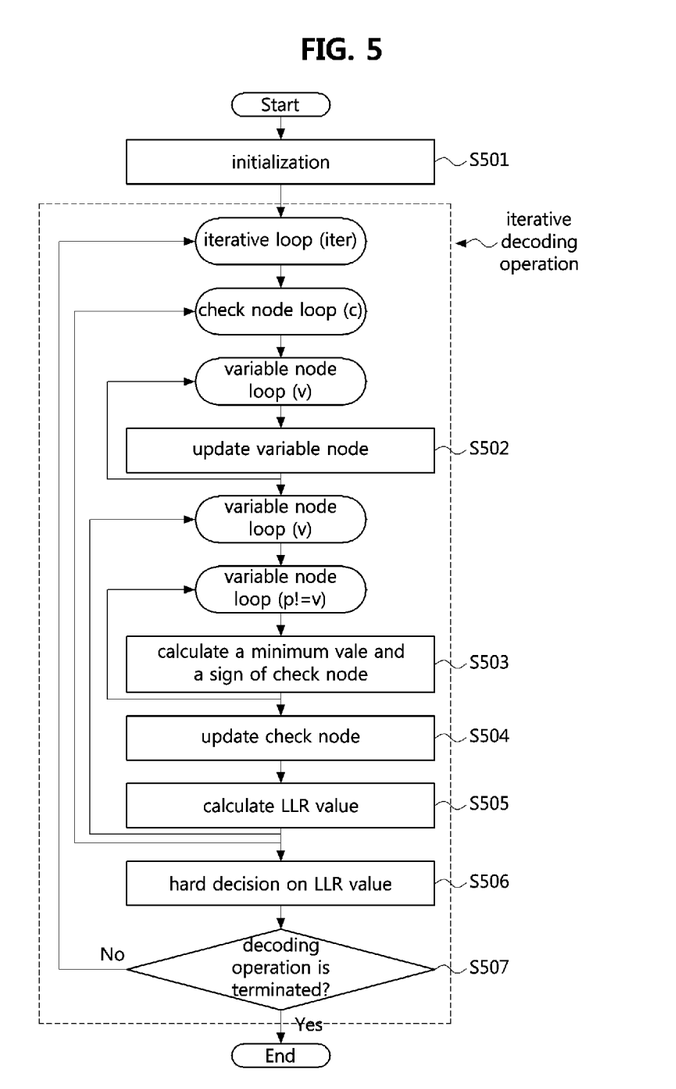
FIG. 5 is a flowchart illustrating a second exemplary embodiment of an LDPC code decoding operation.

FIG. 5 is a flowchart illustrating a second exemplary embodiment of an LDPC code decoding operation.

Referring to FIG. 5, the LDPC code decoding operation may be performed by the LDPC decoder 321 shown in FIG. 3. The operation(s) of the LDPC decoder 321 may be performed by the processor 210 shown in FIG. 2. The LDPC decoder may decode a LDPC code by calculating a sign and a minimum value of $Qtemp_{vc}$ for all $v \in N(c)$. The receiving node (e.g., LDPC decoder included in the receiving node) may perform an initialization operation S501 based on Equation 9 below.

for all $v \in V, c \in C$ $R_{cv} = 0$ for all $v \in V$ $Q_v = P_v$ [Equation 9]

When the initialization operation S501 is completed, the receiving node may perform an iterative decoding operation. The iterative decoding operation may be performed based on Equation 10 below.

[Equation 10]

for all $c \in C$ (10-1)
for all $v \in N(c)$ $Qtemp_{vc} = Q_v - R_{cv}$
for $\forall v \in N(c)$ $$R_{cv} = \prod_{v' \in N(c) \setminus v} \text{sign}(Qtemp_{v'c}) \times \min_{v' \in N(c)} |Qtemp_{v'c}| \quad (10\text{-}2)$$

$Q_v = Qtemp_{vc} + R_{cv}$ (10-3)
end of loop
end of loop

When the iterative decoding operation is performed based on the N-MSA, the receiving node may use Equation 7 instead of Equation 10-2. Alternatively, when the iterative decoding operation is performed based on the O-MSA, the receiving node may use Equation 8 instead of Equation 10-2.

The iterative decoding operation may include an update operation S502 of the variable nodes, an operating S503 of calculating a minimum value and a sign of the check node, an update operation S504 of the check nodes, an operation S505 of calculating the LLR value, a hard decision operation S506 for the LLR value, and a termination determination operation S507 of the decoding operation. The steps S502 to S507 may be iteratively performed.

For example, when the initialization operation S501 is completed, the receiving node may perform the update operation S502 of the variable nodes. The update operation S502 of the variable nodes may be performed based on Equation 3. When the update operation S502 of the variable nodes is completed, the receiving node may calculate a minimum value of the check node and calculate a sign for the check node (S503). When the operation S503 of calculating the minimum value and sign of the check node is completed, the receiving node may perform the update operation S504 of the check nodes. The update operation S504 of the check nodes may be performed based on Equation 10-2.

When the update operation S504 of the check nodes is completed, the receiving node may calculate the LLR values (S505). The operation S505 of calculating the LLR values may be performed based on Equation 10-3. When the operation S505 of calculating the LLR values is completed, the receiving node may determine an output value $\hat{y}_v$, by performing the hard decision operation S506 on the LLR value. The hard decision operation S506 may be performed based on Equation 5.

The receiving node may determine whether the decoding operation is terminated based on the output value $\hat{y}_v$ of the step S506 (S507). When a result of a syndrome check is $\hat{y}_v H^T = 0$, when a CRC for the output value $\hat{y}_v$ is successful, or when the iterative decoding operation is performed as many as a preset number of iterations, the receiving node may determine that the decoding operation is terminated (S606). When the above-described condition is not satisfied, the receiving node may determine that the decoding operation is not terminated, and may perform the iterative decoding operations (e.g., S502 to S507) again.

Meanwhile, in order to compensate for a loss of error correction capability due to approximation in the decoding operation of the LDPC code based on the MSA, the following exemplary embodiments may be performed. In the conventional MSA-based decoding operation of an LDPC code, the update operation of the check nodes may be performed using a value of a variable node having a minimum value among all neighboring variable nodes in a loop of the check node. On the other hand, in the loop of the check node, a plurality of minimum values (e.g., three minimum values) may be obtained among all neighboring variable nodes, and indices vidx corresponding to the plurality of minimum values may be determined. When the number of minimum values is three, the three minimum values may include a first minimum value, a second minimum value, and a third minimum value. The first minimum value may be the smallest minimum value among the minimum values. The second minimum value may be greater than the first minimum value, and the third minimum value may be greater than the second minimum value.

The first minimum value v1 may be defined as $$v1 = \min_{v \in N(c)} |Qtemp_{vc}|,$$

the second minimum value v2 may be defined as $$v2 = \min_{v \in N(c) \backslash v1} |Qtemp_{vc}|,$$

and the third minimum value v3 may be defined as $$v3 = \min_{v \in N(c) \backslash \{v1, v2\}} |Qtemp_{vc}|.$$

vidx1 may be an index of a variable node having the first minimum value v1, vidx2 may be an index of a variable node having the second minimum value v2, and vidx3 may be an index of a variable having the third minimum value v3. The relationship between v1, v2, and v3 may be defined as in Equation 11 below.

$$v1 \leq v2 \leq v3 \qquad \text{[Equation 11]}$$

In the calculation operation for the check node, the minimum value may be calculated based on Equation 12 below.

$$f(a,b) = (a*b)/(a+b) \qquad \text{[Equation 12]}$$

The LDPC code decoding operation based on the above-described method may be performed as follows.

Figure 6:
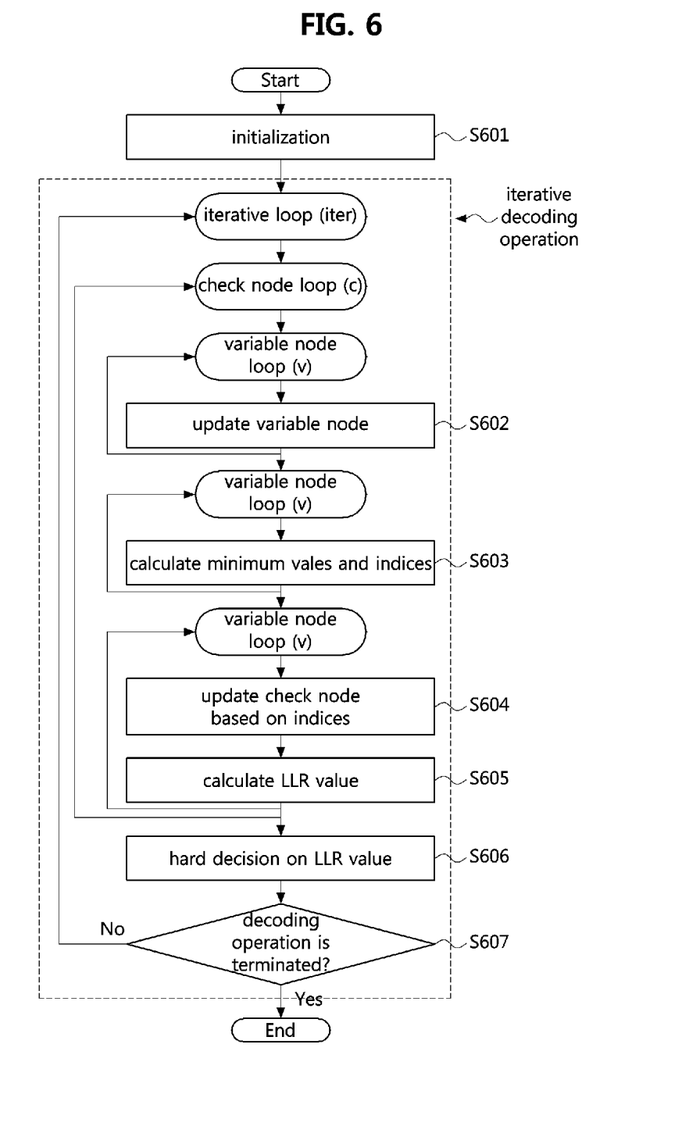
FIG. 6 is a flowchart illustrating a third exemplary embodiment of an LDPC code decoding operation.

FIG. 6 is a flowchart illustrating a third exemplary embodiment of an LDPC code decoding operation.

Referring to FIG. 6, the LDPC code decoding operation may be performed by the LDPC decoder 321 shown in FIG. 3. The operation(s) of the LDPC decoder 321 may be performed by the processor 210 shown in FIG. 2. The receiving node (e.g., LDPC decoder included in the receiving node) may perform an initialization operation S601 based on Equation 13 below. In addition, the receiving node may calculate a normalization coefficient for the N-MSA or an offset for the O-MSA.

for all $v \in V, c \in C$ $R_{cv} = 0$ for all $v \in V$ $Q_v = P_v$ $\qquad$ [Equation 13]

When the initialization operation is completed, the receiving node may perform an iterative decoding operation. The iterative decoding operation may be performed based on Equation 14 below.

[Equation 14]

for all $c \in C$ $\qquad$ (14-1)
for all $v \in N(c)$ $Qtemp_{vc} = Q_v - R_{cv}$
for all $v \in N(c) v1 = \min_{v' \in N(c)} |Qtemp_{v'c}|$ for all $v \in N(c) v2 = \min_{v' \in N(c) \backslash vidx1} |Qtemp_{v'c}|$ $\qquad$ (14-2)

for all $v \in N(c) v3 = \min_{v' \in N(c) \backslash \{vidx1, vidx2\}} |Qtemp_{v'c}|$ $\qquad$ (14-3)

for $\forall v \in N(c)$ if $(v = vidx1)$ $Rtemp = f(v2, v3)$ $\qquad$ (14-4)

else if $(v = vidx2)$ $Rtemp = f(v1, v3)$ $\qquad$ (14-5)

else $Rtemp = f(v1, v2)$ $\qquad$ (14-6)

$$R_{cv} = \prod_{v' \in N(c) \backslash v} \text{sign}(Qtemp_{v'c}) \times Rtemp \qquad (14\text{-}7)$$

$Q_v = Qtemp_{vc} + R_{cv}$ $\qquad$ (14-8)
end of loop
end of loop

The iterative decoding operation may include an update operation S602 of the variable nodes, an operation S603 of determining minimum values and indices, an update operation S604 of the check nodes based on the minimum values and indices, an operation S605 of calculating the LLR value, a hard decision operation S606 on the LLR value, and a termination determination operation S607 of the decoding operation. The steps S602 to S607 may be iteratively performed.

For example, when the initialization operation S601 is completed, the receiving node may perform the update operation S602 of the variable nodes. The update operation S602 of the variable nodes may be performed based on Equation 3. When the update operation S602 of the variable nodes is completed, the receiving node may calculate a plurality of minimum values of the check node and determine indices corresponding to the plurality of minimum values (S603). Here, the number of the plurality of minimum values may be three, and three indices corresponding to the three minimum values may be determined. The step S603 may be performed based on Equations 14-1 to 14-3.

When the operation S603 of determining the minimum values and indices is completed, the receiving node may update the check node based on the minimum values and/or indices (S604). The step S604 may be performed based on Equations 14-4 to 14-7. When the N-MSA is used, the receiving node may update the check node using Equation 15 below instead of Equation 14-7 (S604). When the N-MSA is used, a performance gain may be obtained in a high SNR region. Alternatively, the step S604 may be performed based on the O-MSA.

$$R_{cv} = \alpha \times \prod_{v' \in N(c) \backslash v} \text{sign}(Qtemp_{v'c}) \times Rtemp \qquad \text{[Equation 15]}$$

When the update operation S604 of the check nodes is completed, the receiving node may calculate the LLR value (S605). The operation S605 of calculating the LLR value may be performed based on Equation 14-8. When the operation S605 of calculating the LLR value is completed, the receiving node may determine an output value $\hat{y}_v$ by performing a hard decision S606 on the LLR value. The hard decision operation S606 may be performed based on Equation 5.

The receiving node may determine whether the decoding operation is terminated based on the output value $\hat{y}_v$ of the step S606 (S607). When a result of a syndrome check is $\hat{y}_v H^T=0$, when a CRC for the output value $\hat{y}_v$ is successful, or when the iterative decoding operation is performed as many times as the preset number of iterations, the receiving node determines that the decoding operation is terminated (S607). When the above-described condition is not satisfied, the receiving node may determine that the decoding operation is not terminated, and may perform the iterative decoding operation (e.g., S602 to S607) again.

Hereinafter, performance analysis results according to the above-described exemplary embodiments will be described. Here, the H matrix defined in the 5G (e.g., new radio (NR)) technical specification may be used. The LDPC encoder included in the transmitting node (e.g., transmitting node 310 shown in FIG. 3) may output coded bits (e.g., codeword) by performing an encoding operation using the H matrix. The modulator included in the transmitting node may perform a modulation operation on the coded bits output from the LDPC encoder. Here, the modulation operation may be performed based on a binary phase shift keying (BPSK) scheme. A signal generated by the transmitting node may be transmitted through an additive white Gaussian noise (AWGN) channel.

The receiving node (e.g., receiving node 320 shown in FIG. 3) may receive the signal from the transmitting node. The received signal may be input to the demodulator included in the receiving node. The demodulator may perform a demodulation operation on the received signal. Here, the demodulation operation may be performed based on the BPSK scheme. An output value (e.g., LLR value) of the demodulator may be input to the LDPC decoder. The LDPC decoder may perform a decoding operation on the output value of the demodulator. An error check may be performed on an output value of the LDPC decoder. When there is no error in the output value of the LDPC decoder, the decoding operation may be terminated. Each of a bit error rate (BER) and a frame error rate (FER) may be calculated through comparison between the signal transmitted from the transmitting node and the output value of the LDPC decoder included in the receiving node.

The environment and parameter(s) for the performance analysis of the LDPC code decoding operations may be configured as follows.

Base graph 1
LDPC lifting size Z: 128
Maximum number of iterations: 40
Modulation and demodulation scheme: BPSK
Channel: AWGN Channel FIG. 7 is a first graph illustrating performance of an LDPC code decoding operation, and FIG. 8 is a second graph illustrating performance of an LDPC code decoding operation.

Figure 7:
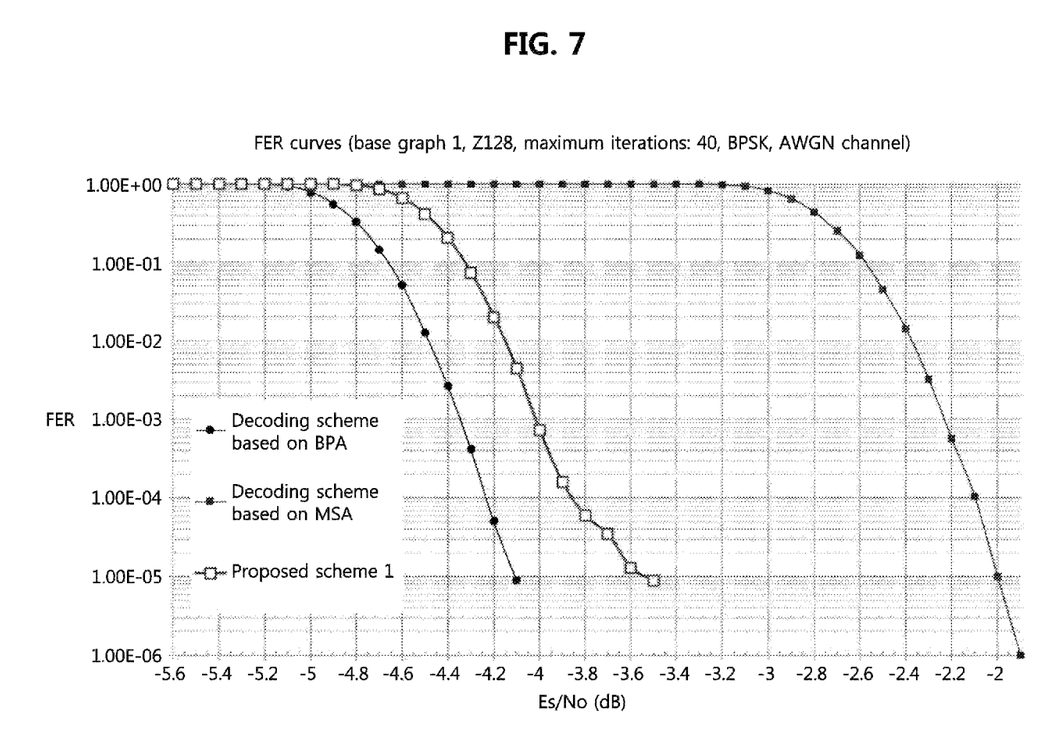
FIG. 7 is a first graph illustrating performance of an LDPC code decoding operation.
Figure 8:
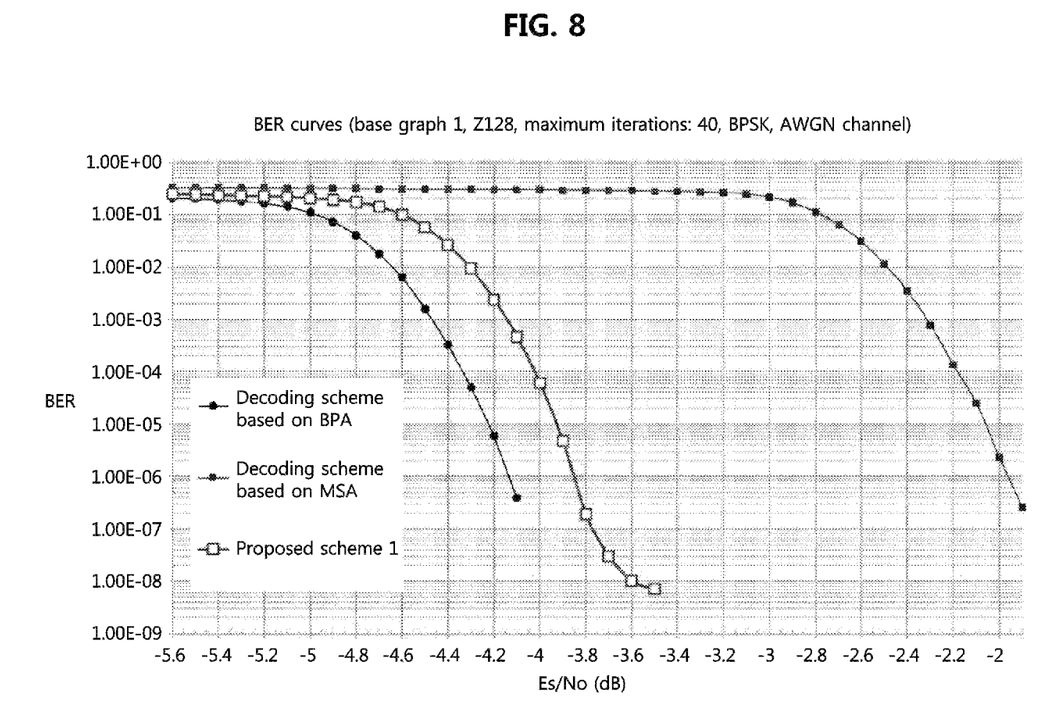
FIG. 8 is a second graph illustrating performance of an LDPC code decoding operation.

Referring to FIGS. 7 and 8, the BPA-based scheme may be the decoding method shown in FIG. 4, and the MSA-based scheme may be the decoding method shown in FIG. 4 or 5. The proposed scheme 1 may be a decoding scheme based on the MSA shown in FIG. 6. In the graph shown in FIG. 7, the proposed scheme 1 may have a performance gain of about 1.8 dB compared to the MSA-based scheme at a FER $1^{-4}$. In the graph shown in FIG. 8, the proposed scheme 1 according to the present disclosure may have a performance gain of about 1.9 dB compared to the MSA-based scheme at a BER $1^{-6}$.

Figure 9:
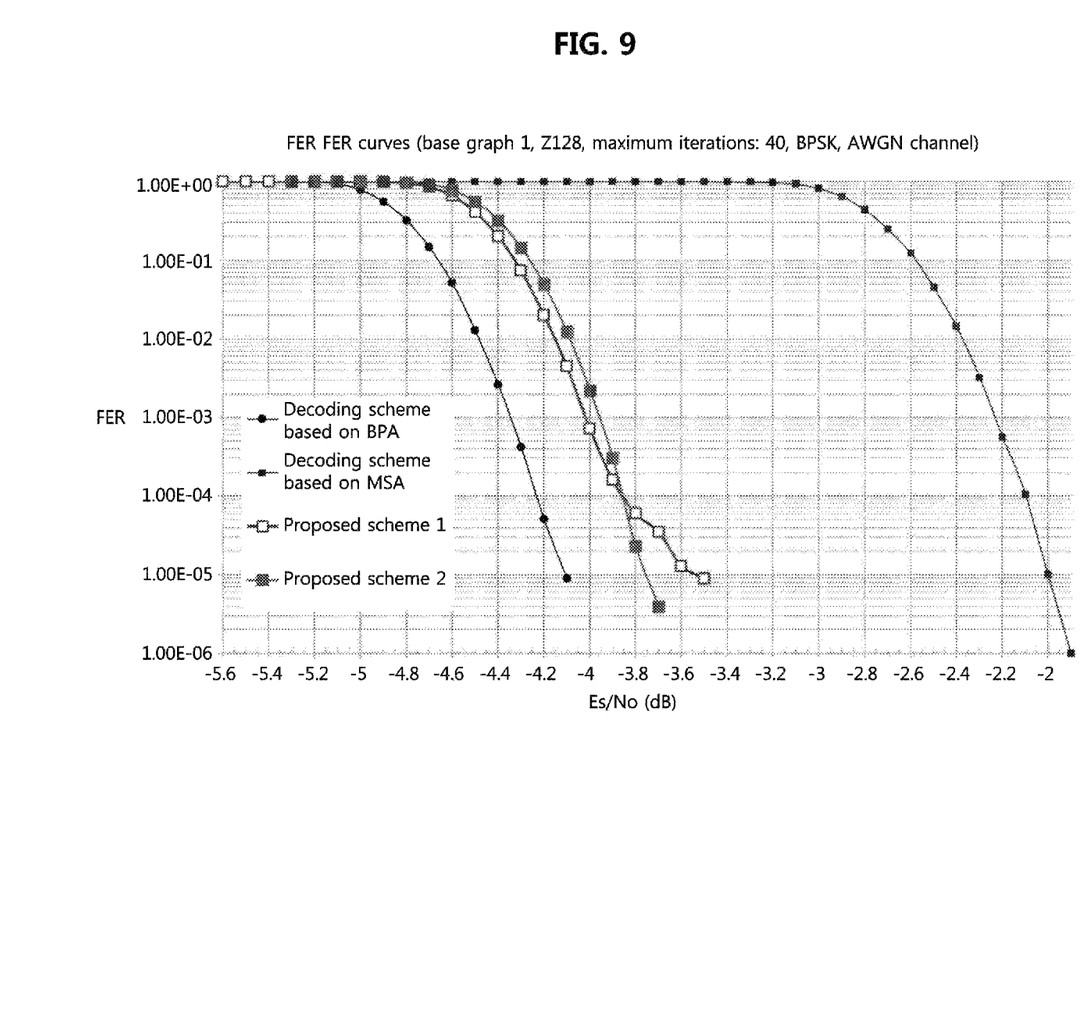
FIG. 9 is a third graph illustrating performance of an LDPC code decoding operation.
Figure 10:
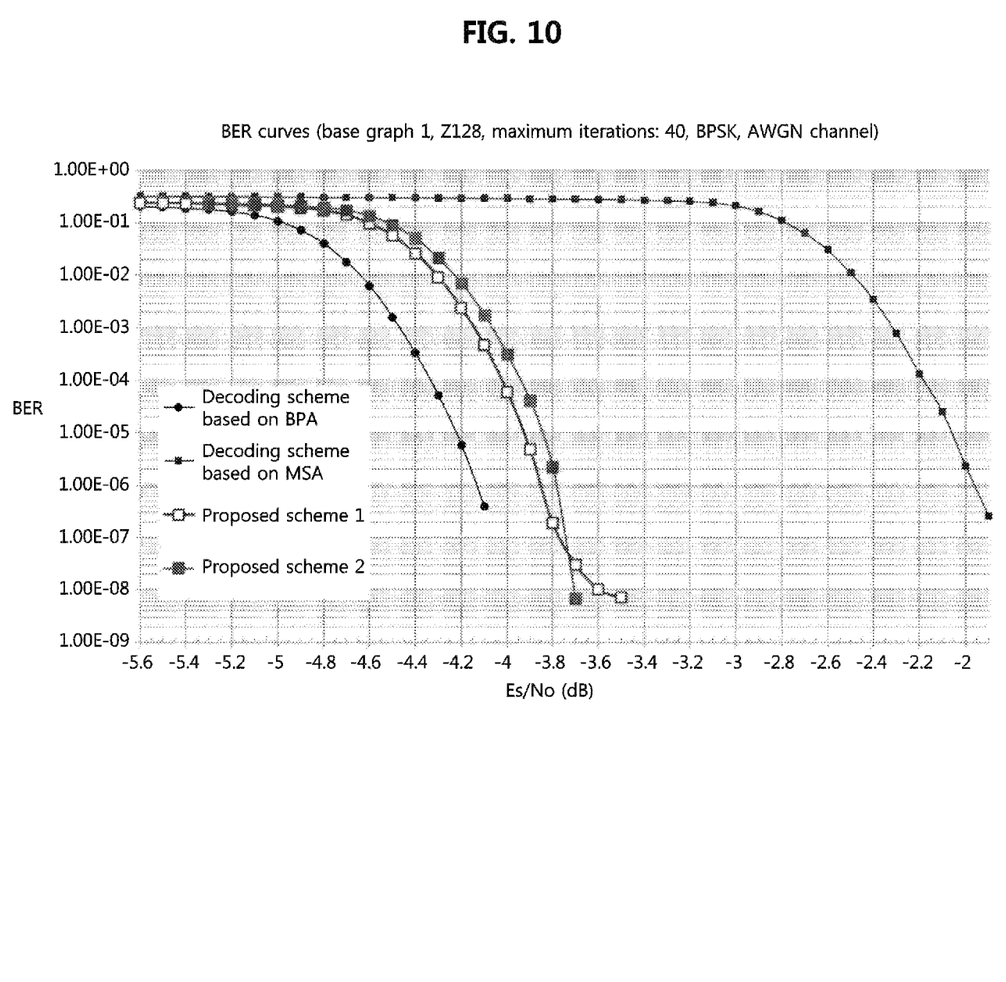
FIG. 10 is a fourth graph illustrating performance of an LDPC code decoding operation.

FIG. 9 is a third graph illustrating performance of an LDPC code decoding operation, and FIG. 10 is a fourth graph illustrating performance of an LDPC code decoding operation.

Referring to FIGS. 9 and 10, the BPA-based scheme may be the decoding method shown in FIG. 4, and the MSA-based scheme may be the decoding method shown in FIG. 4 or 5. The proposed scheme 1 may be a decoding scheme based on the MSA shown in FIG. 6, and the proposed scheme 2 may be a decoding scheme based on the N-MSA shown in FIG. 6. Here, the normalization coefficient α may be 1.1.

In the graph shown in FIG. 9, the performance gain of the FER according to the proposed schemes 1 or 2 may be higher than that of the FER of the MSA-based decoding scheme. In the graph shown in FIG. 10, the performance gain of the BER according to the proposed scheme 1 or 2 may be higher than the performance gain of the BER of the MSA-based decoding scheme.

The exemplary embodiments of the present disclosure may be implemented as program instructions executable by a variety of computers and recorded on a computer readable medium. The computer readable medium may include a program instruction, a data file, a data structure, or a combination thereof. The program instructions recorded on the computer readable medium may be designed and configured specifically for the present disclosure or can be publicly known and available to those who are skilled in the field of computer software.

Examples of the computer readable medium may include a hardware device such as ROM, RAM, and flash memory, which are specifically configured to store and execute the program instructions. Examples of the program instructions include machine codes made by, for example, a compiler, as well as high-level language codes executable by a computer, using an interpreter. The above exemplary hardware device can be configured to operate as at least one software module in order to perform the embodiments of the present disclosure, and vice versa.

While the embodiments of the present disclosure and their advantages have been described in detail, it should be understood that various changes, substitutions and alterations may be made herein without departing from the scope of the present disclosure.

What is claimed is:

1. A method for decoding a low-density parity-check (LDPC) code, performed by a first communication apparatus, the method comprising:
receiving a signal including data from a second communication apparatus;
updating a variable node for decoding the signal;
determining a first minimum value (v1), a second minimum value (v2), and a third minimum value (v3) based on a min-sum algorithm (MSA);
calculating f(v2,v3) based on f(v2,v3)=(v2*v3)/(v2+v3) when the v1 is the smallest value among the v1, the v2, and the v3, calculating f(v1,v3) based on f(v1,v3)= (v1*v3)/(v1+v3) when the v2 is the smallest value among the v1, the v2, and the v3, or calculating f(v1,v2) based on f(v1,v2)=(v1*v2)/(v1+v2) when the v3 is the smallest value among the v1, the v2, and the v3;
updating a check node using the f(v2,v3), the f(v1,v3), or the f(v1,v2);

calculating a log-likelihood ratio (LLR) value when the update of the check node is completed;

determining an information bit based on the LLR value; and restoring the data included in the signal based on the information bit.

2. The method according to claim 1, wherein the check node is updated based on the MSA in which a normalization coefficient is reflected.

3. The method according to claim 1, wherein the check node is updated based on the MSA in which an offset is reflected.

4. The method according to claim 1, further comprising initializing one or more parameters used for decoding the LDPC code, wherein after the initialization of the one or more parameters is completed, the update operation of the variable node is performed.

5. The method according to claim 1, wherein the variable node and the check node belong to a Tanner graph, and the Tanner graph is generated based on an H matrix used for encoding the LDPC code.

6. The method according to claim 1, wherein when a cyclic redundancy check (CRC) or syndrome check for the information bit succeeds, the decoding of the LDPC code is terminated, and when the CRC or syndrome check for the information bit fails, the decoding is iteratively performed.

7. A first communication apparatus for decoding a low-density parity-check (LDPC) code, the first communication apparatus comprising a processor, a memory electronically communicating with the processor, and instructions stored in the memory, wherein when executed by the processor, the instructions cause the first communication apparatus to:

receive a signal including data from a second communication apparatus;

update a variable node for decoding the signal;

determine a first minimum value (v1), a second minimum value (v2), and a third minimum value (v3) based on a min-sum algorithm (MSA);

calculate f(v2,v3) based on f(v2,v3)=(v2*v3)/(v2+v3) when the v1 is the smallest value among the v1, the v2, and the v3, calculate f(v1,v3) based on f(v1,v3)= (v1*v3)/(v1+v3) when the v2 is the smallest value among the v1, the v2, and the v3, or calculate f(v1,v2) based on f(v1,v2)=(v1*v2)/(v1+v2) when the v3 is the smallest value among the v1, the v2, and the v3;

update a check node using the f(v2,v3), the f(v1,v3), or the f(v1,v2);

calculate a log-likelihood ratio (LLR) value when the update of the check node is completed;

determine an information bit based on the LLR value; and restore the data included in the signal based on the information bit.

8. The first communication apparatus according to claim 7, wherein the check node is updated based on the MSA in which a normalization coefficient is reflected.

9. The first communication apparatus according to claim 7, wherein the check node is updated based on the MSA in which an offset is reflected.

10. The first communication apparatus according to claim 7, wherein the variable node and the check node belong to a Tanner graph, and the Tanner graph is generated based on an H matrix used for encoding the LDPC code.

11. The first communication apparatus according to claim 7, wherein when a cyclic redundancy check (CRC) or syndrome check for the information bit succeeds, the decoding of the LDPC code is terminated, and when the CRC or syndrome check for the information bit fails, the decoding is iteratively performed.

* * * * *